United States Patent [19]

Rorden

[11] Patent Number: 4,525,677
[45] Date of Patent: Jun. 25, 1985

[54] DIFFERENTIAL AMPLIFIER HAVING HIGH COMMON-MODE REJECTION RATIO

[75] Inventor: William L. Rorden, Grass Valley, Calif.

[73] Assignee: The Grass Valley Group, Inc., Grass Valley, Calif.

[21] Appl. No.: 540,988

[22] Filed: Oct. 12, 1983

[51] Int. Cl.³ .............................................. H03F 3/45
[52] U.S. Cl. ...................................... 330/258; 330/69; 330/85; 330/260
[58] Field of Search ................... 330/69, 85, 258, 260

[56] References Cited

U.S. PATENT DOCUMENTS 2,977,547  3/1961  Talambiras ........................... 330/69

Primary Examiner—James B. Mullins
Attorney, Agent, or Firm—John Smith-Hill

[57] ABSTRACT

A differential input receiver having normal and common mode impedance balanced inputs and a common mode rejection ratio approaching infinity is provided. The receiver includes a differential input operational amplifier across which is connected a fixed gain inverting amplifier. The fixed gain, inverting amplifier being connected in a feedback configuration across the differential input amplifier. Additionally, the values and ratios of the various resistors being selected to provide the balanced differential input and the substantially zero common mode gain of the receiver.

4 Claims, 1 Drawing Figure

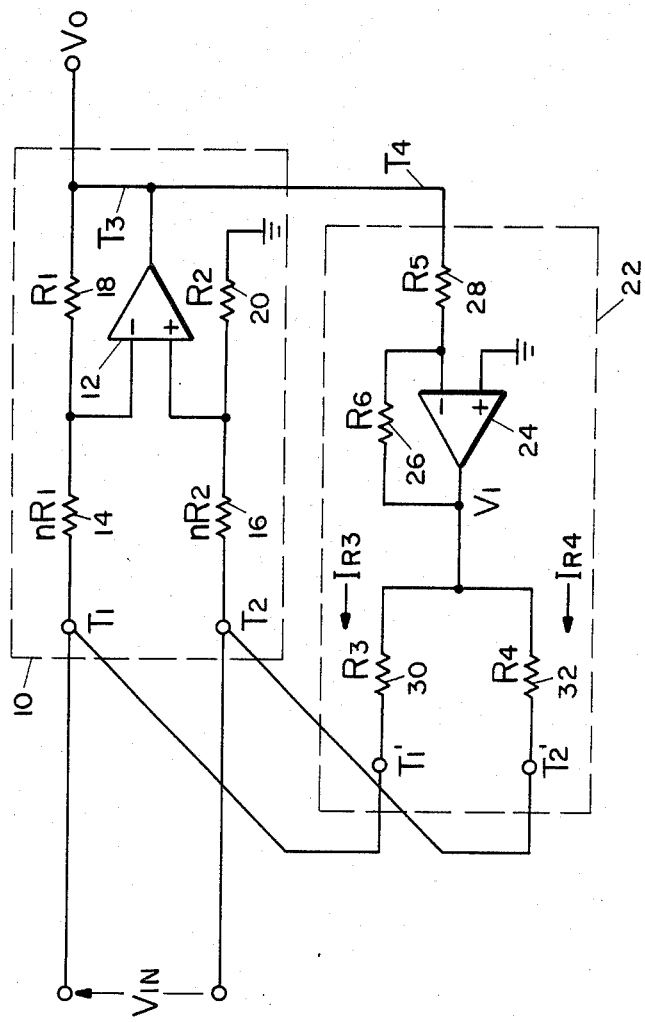

DIFFERENTIAL AMPLIFIER HAVING HIGH COMMON-MODE REJECTION RATIO

BACKGROUND OF THE INVENTION

A typical mode of transmitting information is by means of a balance wire pair. The wire pair is excited by a generator which applies a complementary, or out of phase, signal on each of the wires. These signals are referred to as differential mode signals. Telephone systems typically use this type of system.

Signals which are introduced electrostatically or magnetically into the two wire system produce a signal on each of the two wires which are in-phase with each other. These signals are referred to as common mode signals.

The problem in a receiving device is to distinguish between the differential mode signals and the undesirable common mode signals. The ability of a particular system component, such as an amplifier, to ignore the common mode interference is referred to as common mode rejection. Common mode rejection is defined as the ratio of the differential mode gain to the common mode gain.

In addition to providing a high common mode rejection ratio, a balanced input impedance to both the differential and common mode signals (i.e. an equivalent impedance to ground looking into each terminal of the differential input node) is desired. The classic single operational amplifier circuit presents this undesirable imbalance situation. Previous solutions to the problem include open loop non-feedback amplifiers and transformers both of which are expensive and, in the case of transformers, do not operate for low frequency and D.C. signals. Additionally, there ave been circuits having three or more operational amplifiers with voltage dividers. These circuits act to cancel the in-phase common mode interference within the accuracy to which the voltage dividers were matched. The differential, or normal, mode voltages were passed through to the next circuit stage. These circuits were commonly used as line receivers and in lower frequency ranges.

However these circuits have the problem that the input impedances to differential mode signals are not balanced at the two input terminals. Attempts to maintain the desired common mode rejection and balance the impedances at the two signal input terminals involved increasing the complexity of the circuit. In particular, at least three operational amplifiers were required to approach the desired performance objectives.

SUMMARY OF THE INVENTION

The present invention includes two operational amplifiers, a differential input amplifier and a fixed gain inverting amplifier which are interconnected to provide a balanced impedance differential input and a substantially zero common mode gain (substantially infinity common mode rejection ratio).

The differential input amplifier provides the forward signal path with the ratio of the resistance values having been selected to provide a substantially zero common mode gain. To balance the differential input impedances the fixed gain inverting amplifier is used to provide a feedback path.

DESCRIPTION OF THE DRAWING

FIG. 1 is a schematic diagram of the circuit of the present invention.

DESCRIPTION OF THE PREFERRED EMBODIMENT

Referring to FIG. 1 there is shown a differential input amplifier 10 and a fixed gain inverting amplifier 22 connected thereacross in a feedback configuration.

Amplifier 10 includes an operational amplifier 12 with one end of resistors 14 and 16 connected to its inverting and non-inverting input terminals, respectively. The other end of these resistors provide the differential input terminals of amplifier 10, $T_1$ and $T_2$, respectively. In addition, feedback resistor 18 is connected between the inverting input terminal and the positive output terminal of operational amplifier 12, and resistor 20 is connected between the non-inverting terminal of operational amplifier 12 and ground. The positive output terminal of operational amplifier 12 provides the output terminal $T_3$ of amplifier 10. Fixed gain inverting amplifier 22 includes an operational amplifier 24 with its non-inverting input terminal connected to ground. Amplifier 22 also includes a feedback resistor 26 connected between the inverting input terminal and the non-inverting output terminal of operational amplifier 24, an input resistor 28 having one end connected to the inverting input terminal of operational amplifier 24 and its other end providing the input terminal $T_4$ of amplifier 22, and a pair of output resistors 30 and 32 each having one end connected to the positive output terminal of operational amplifier 24. The other ends of each of resistors 30 and 32 provide the output terminals $T_1'$ and $T_2'$, respectively, of amplifier 22.

Amplifiers 10 and 22 are interconnected with each other by connecting the output terminal $T_3$ of amplifier 10 with the input terminal $T_4$ of amplifier 22, and the output terminals $T_1'$ and $T_2'$ of amplifier 22 with terminals $T_1$ and $T_2$ of amplifier 10. Thus, in the overall system, the differential input terminals are $T_1$ and $T_2$, and the output terminal is $T_3$.

In order to have a balanced receiver for all signals and to have a common mode rejection ratio that approaches infinity, amplifier 22 has been connected in a feedback configuration across amplifier 10 and the values of each of the resistors are selected as discussed below to achieve those results.

The first step in the analysis is to look at amplifier 10 independent of amplifier 22. First we want to look at the gain from input terminals $T_1$ and $T_2$ to output terminal $T_3$. These gains are:

$$A_1 = \frac{-R_1}{nR_1} = \frac{-1}{n} \bigg|_{T_2 \text{ grounded}} \quad (1)$$

$$A_2 = \frac{1}{1+n} \times \frac{n+1}{n} = \frac{1}{n} \bigg|_{T_1 \text{ grounded.}} \quad (2)$$

By definition the common mode gain of an operational circuit like amplifier 10 is:

$$A_{c.m.} = A_1 + A_2, \quad (3)$$

and the differential, or normal, mode gain is:

$$A_n = \frac{A_1 - A_2}{2}. \tag{4}$$

Thus, by substituting the results of equations (1) and (2) into equations (3) and (4) we obtain:

$$A_{c.m.} = \frac{-1}{n} + \frac{1}{n} = 0 \tag{5}$$

and $$A_n = \tfrac{1}{2}\left(\frac{-1}{n} - \frac{1}{n}\right) = \frac{-1}{n} \tag{6}$$

where $v_{in} = V_{T1} - V_{T2}$.

Additionally, the input impedances at $T_1$ and $T_2$ are:

$$Z_1 = nR_1 \tag{7}$$
and
$$Z_2 = (1+n)R_2. \tag{8}$$

Converting impedances $Z_1$ and $Z_2$ to admittances we have:

$$Y_1 = \frac{1}{nR_1} \tag{9}$$

$$Y_2 = \frac{1}{(1+n)R_2}. \tag{10}$$

Next, consider the effect of the interconnection of terminals $T_1$ and $T_2$ with $T_1'$ and $T_2'$; the gain and common mode balance of amplifier 10 remain unchanged. Now, $$\text{let } R_1 = R_2 \text{ and } R_5 = R_6 \tag{11}$$

We can see that $$I_{R3} = \frac{V_{T1} - v_1}{R_3} = \frac{V_{T1}\left(1 - \frac{1}{n}\right)}{R_3}. \tag{12}$$

and $$I_{R4} = \frac{V_{T2} - v_1}{R_4} = \frac{V_{T2}\left(1 + \frac{1}{n}\right)}{R_4} \tag{13}$$

where $v_1 = -v_0$ (i.e. $R_5 = R_6$). \hfill (14)

From these current values we see that the combined input admittances at $T_1$ and $T_2$ are:

$$Y_1' = \frac{1}{nR_1} + \left(1 - \frac{1}{n}\right)\frac{1}{R_3} \tag{15}$$

and $$Y_2' = \frac{1}{(1+n)R_1} + \left(1 + \frac{1}{n}\right)\frac{1}{R_3} \tag{16}$$

where $R_3 = R_4$.

The addition of $R_3$ and $R_4$ does not unbalance the common mode input impedance.

Next, we want to find $R_3/R_1$ for $$Y_1' = Y_2' \tag{17}$$

The equating of the input admittances of the system is necessary to achieve differential mode balance. Substituting into equation (17) we have:

$$\frac{1}{nR_1} + \left(\frac{n-1}{n}\right)\frac{1}{R_3} = \frac{1}{(1+n)R_1} + \left(\frac{n+1}{n}\right)\frac{1}{R_3} \tag{18}$$

$$\frac{1}{R_1}\left(\frac{1}{n} - \frac{1}{1+n}\right) = \frac{1}{R_3}\left(\frac{n+1}{n} - \frac{n-1}{n}\right) \tag{19}$$

$$\frac{1}{R_1}\left(\frac{1+n-n}{n(1+n)}\right) = \frac{1}{R_3}\left(\frac{n+1-n+1}{n}\right) \tag{20}$$

$$\frac{1}{R_1}\left(\frac{1}{n(1+n)}\right) = \frac{1}{R_3}\left(\frac{2}{n}\right) \tag{21}$$

$$\frac{R_3}{R_1} = 2(1+n) \tag{22}$$

for $R_1 = R_2$ and $R_3 = R_4$.

In summary, the conditions on the circuit of FIG. 1 included in the above analysis for zero common mode gain and a balanced input impedance are:

$$\begin{aligned}&R_1 = R_2,\ R_3 = R_4,\ R_5 = R_6 \text{ and}\\ &R_3 = 2(1+n)R_1.\end{aligned} \tag{23}$$

This circuit was built and its operation was successfully demonstrated with the following parameter values:

$R_1 = R_2 = 10K$
$n = 4$
$nR_1 = nR_2 = 40K$
$R_3 = R_4 = 100K.$
$R_5 = R_6 = 10K.$

While the above analysis was conducted for a unity ratio of the values of $R_1$ to $R_2$, $R_3$ to $R_4$ and $R_5$ to $R_6$, it could have been done for other ratios of those values.

If the ratio of $R_5$ to $R_6$ was other than unity, the gain of amplifier 22 would be other than unity resulting in $$v_1 = -kv_0 \tag{24}$$

This would simply add the constant value of k to equations 12 through 23. With respect to the ratios of $R_1$ to $R_2$ and $R_3$ to $R_4$, the unity ratio is selected to maintain the desired common mode balance. However, if a specific imbalance is desired, a general solution can be found through the variation of those ratios, but it is believed that such a circuit would be of limited practical value.

While there has been shown and described the preferred embodiment of the present invention, it will be apparent to those skilled in the art that many changes and modifications may be made without departing from the invention in its broader aspects. Therefore, the appended claims are intended to cover all such modifications and changes that fall within the true spirit and scope of the invention.

I claim:

1. A differential amplifier comprising:
   a first operational amplifier having an inverting and a non-inverting input terminal and a non-inverting output terminal which also serves as the output terminal of the differential amplifier;
   a first resistor having one end connected to the inverting input terminal of the first operational amplifier and its other end forming the first of the differential input terminals of the differential amplifier;
   a second resistor connected between the inverting input and non-inverting output terminals of the first operational amplifier;
   a third resistor having one end connected to the non-inverting input terminal of the first operational amplifier and its other end forming the second of the differential input terminals of the differential amplifier; and
   a fourth resistor connected between the non-inverting input terminal of the first operational amplifier and ground;
   wherein the ratio of the value of the first resistor to the value of the second resistor is equal to the ratio of the value of the third resistor to the value of the fourth resistor; and
   a fixed gain inverting amplifier having its input terminal connected to the output terminal of the differential amplifier and its output terminals connected to the input terminals of the differential terminals, said fixed gain inverting amplifier including:
   a second operational amplifier being connected in a fixed gain inverting configuration having an input and an output terminal with its input terminal forming the input terminal of the fixed gain inverting amplifier; and
   a fifth and a sixth resistor each having one end connected to the output terminal of the second operational amplifier and each of their other ends forming an output terminal of the fixed gain inverting amplifier.

2. An amplifier as in claim 1 wherein the values of the fifth and sixth resistors are equal.

3. An amplifier as in claim 2 wherein the gain of the second operational amplifier is minus one.

4. An amplifier as in claim 3 wherein the ratio of the first resistor to the second resistor is equal to n, the values of the second and fourth resistors are equal, and the values of the second, fifth and sixth resistors are related by the expression $$R_{fifth} = R_{sixth} = 2(1+n)R_{second}.$$